United States Patent
Suzuki et al.

(10) Patent No.: US 10,685,932 B2
(45) Date of Patent: Jun. 16, 2020

(54) SEMICONDUCTOR DEVICE

(71) Applicant: Mitsubishi Electric Corporation, Tokyo (JP)

(72) Inventors: Sho Suzuki, Tokyo (JP); Tsuyoshi Osaga, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 16 days.

(21) Appl. No.: 16/082,244

(22) PCT Filed: Jun. 8, 2016

(86) PCT No.: PCT/JP2016/067080
§ 371 (c)(1),
(2) Date: Sep. 4, 2018

(87) PCT Pub. No.: WO2017/212578
PCT Pub. Date: Dec. 14, 2017

(65) Prior Publication Data
US 2020/0144215 A1 May 7, 2020

(51) Int. Cl.
*H01L 31/0312* (2006.01)
*H01L 23/00* (2006.01)
*H01L 29/45* (2006.01)

(52) U.S. Cl.
CPC ............ *H01L 24/30* (2013.01); *H01L 24/29* (2013.01); *H01L 29/45* (2013.01); *H01L 29/452* (2013.01);
(Continued)

(58) Field of Classification Search
CPC ......... H01L 24/29; H01L 24/30; H01L 29/45; H01L 29/452
(Continued)

(56) References Cited

U.S. PATENT DOCUMENTS

| | | | |
|---|---|---|---|
| 2014/0070226 A1* | 3/2014 | Alvarez | H01L 23/4827 257/76 |
| 2015/0069614 A1 | 3/2015 | Nishikawa et al. | |
| 2015/0155608 A1 | 6/2015 | Kudoh et al. | |

FOREIGN PATENT DOCUMENTS

| JP | S64-020752 U | 2/1989 |
|---|---|---|
| JP | 2013-014809 A | 1/2013 |

(Continued)

OTHER PUBLICATIONS

An Office Action mailed by the Japanese Patent Office dated Nov. 20, 2018, which corresponds to Japanese Patent Application No. 2018-522230 and is related to U.S. Appl. No. 16/082,244.

(Continued)

*Primary Examiner* — David S Blum
(74) *Attorney, Agent, or Firm* — Studebaker & Brackett PC

(57) ABSTRACT

A semiconductor substrate (1) has a front surface and a back surface that are opposite each other. A first metal layer (2) is formed on the front surface of the semiconductor substrate (1). A second metal layer (3) for soldering is formed on the first metal layer (2). A third metal layer (5) is formed on the back surface of the semiconductor substrate (1). A fourth metal layer (6) for soldering is formed on the third metal layer (5). The second metal layer (3) has a larger thickness than that of the fourth metal layer (6). The first, third, and fourth metal layers (2,5,6) are not divided in a pattern. The second metal layer (3) is divided in a pattern and has a plurality of metal layers electrically connected to each other via the first metal layer (2).

20 Claims, 2 Drawing Sheets

(52) U.S. Cl.
CPC .............. *H01L 2224/29155* (2013.01); *H01L 2224/3003* (2013.01); *H01L 2224/30181* (2013.01); *H01L 2224/30505* (2013.01); *H01L 2924/014* (2013.01); *H01L 2924/01015* (2013.01); *H01L 2924/1033* (2013.01); *H01L 2924/10272* (2013.01); *H01L 2924/3511* (2013.01)

(58) Field of Classification Search
USPC .......................................................... 257/77
See application file for complete search history.

(56) References Cited

FOREIGN PATENT DOCUMENTS

| | | |
|---|---|---|
| JP | 2013-194291 A | 9/2013 |
| JP | 2015-053455 A | 3/2015 |
| WO | 2013/183132 A1 | 12/2013 |

OTHER PUBLICATIONS

International Search Report issued in PCT/JP2016/067080; dated Jul. 12, 2016.
Written Opinion issued in PCT/JP2016/067080; dated Jul. 12, 2016.
Notification of Transmittal of the International Search Report and the Written Opinion of the International Searching Authority, or the Declaration issued in PCT/JP2016/067080; dated Jul. 12, 2016.

* cited by examiner

SEMICONDUCTOR DEVICE

FIELD

The present invention relates to a semiconductor device wherein metal layers for soldering are formed on both front and back surfaces of a substrate.

BACKGROUND

MOSFETs, IGBTs, or diodes having a high withstand voltage are used as power semiconductor devices. Desirable requirements of a power semiconductor device are favorable electrical characteristics such as low power loss, high destruction tolerance, and small size, as well as low cost. Grinding semiconductor substrates to reduce the thickness is a recent trend in an attempt to achieve both of favorable electrical characteristics and reduction of the chip unit price. A common power semiconductor configuration so far was that a metal layer was formed on a backside electrode of a semiconductor substrate to be reacted with solder for the soldering, while metal wire bonding was performed for the electrodes on the front surface. However, it is increasingly the case that metal layers for soldering are formed on both front and back surfaces of a substrate and soldering is performed for both surfaces, with an aim to achieve low power loss and size reduction.

CITATION LIST

Patent Literature

[PTL 1] Japanese Patent Application Laid-open No. 2015-53455

SUMMARY

Technical Problem

One conventional problem when the thickness or material of metal layers differs between the front surface side and the back surface side of a semiconductor substrate was warpage of the semiconductor substrate, which causes generation of cracks or voids in the solder and adversely affects the assemblability. The trend of grinding semiconductor substrates to make them thinner has led to a dilemma that the semiconductor substrate warpage became more evident. A technique has been disclosed wherein the metal films for soldering formed on both sides are crystallized by heat treatment to counteract the stress generated from both sides and suppress the warpage (see, for example, PTL 1). However, this method requires a heat treatment process after the formation of metal layers on the front surface. Another problem is deterioration of assemblability, because the metal layers oxidize and degrade solder wettability during assembly.

The present invention was made to solve the problem described above and it is an object of the invention to achieve a semiconductor device that can improve assemblability without causing oxidation of metal layers for soldering.

Solution to Problem

A semiconductor device according to the present invention includes: a semiconductor substrate having a front surface and a back surface that are opposite each other; a first metal layer formed on the front surface of the semiconductor substrate; a second metal layer for soldering formed on the first metal layer; a third metal layer formed on the back surface of the semiconductor substrate; and a fourth metal layer for soldering formed on the third metal layer, wherein the second metal layer has a larger thickness than that of the fourth metal layer, the first, third, and fourth metal layers are not divided in a pattern, and the second metal layer is divided in a pattern and has a plurality of metal layers electrically connected to each other via the first metal layer.

Advantageous Effects of Invention

In the present invention, while the first, third, and fourth metal layers are not divided in a pattern, the second metal layer is divided in a pattern. The stress generated when the thick second metal layer expands or contracts due to a temperature change is therefore absorbed by the gaps in the pattern. Therefore, the semiconductor substrate receives less stress and warpage of the semiconductor substrate can be minimized. Consequently, the assemblability can be improved.

DESCRIPTION OF EMBODIMENTS

A semiconductor device according to the embodiments of the present invention will be described with reference to the drawings. The same components will be denoted by the same symbols, and the repeated description thereof may be omitted.

Embodiment 1

Figure 1:
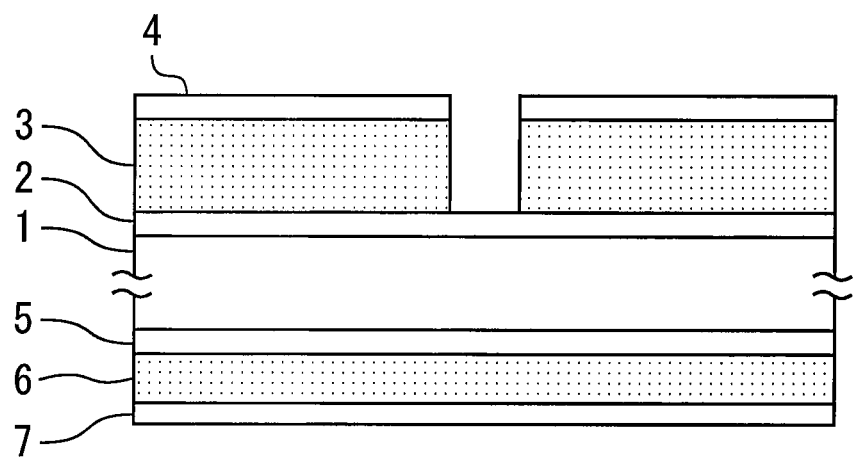
FIG. 1 is a cross-sectional view illustrating a semiconductor device according to Embodiment 1 of the present invention.

FIG. 1 is a cross-sectional view illustrating a semiconductor device according to Embodiment 1 of the present invention. A semiconductor substrate 1 has a front surface and a back surface that are opposite each other. A first metal layer 2 is formed on the front surface of the semiconductor substrate 1 such as to be in direct contact and electrical connection with the front surface of the semiconductor substrate 1. The first metal layer 2 is an emitter electrode of an IGBT, or an anode electrode of a diode, for example. A second metal layer 3 for soldering is formed on the first metal layer 2. A metal layer 4 is formed on the second metal layer 3 for preventing oxidation of the second metal layer 3.

A third metal layer 5 is formed on the back surface of the semiconductor substrate 1 such as to be in direct contact and electrical connection with the back surface of the semiconductor substrate 1. The third metal layer 5 is a collector electrode of an IGBT, or a cathode electrode of a diode, for example. A fourth metal layer 6 for soldering is formed on the third metal layer 5. A metal layer 7 is formed on the fourth metal layer 6 for preventing oxidation of the fourth metal layer 6.

The second metal layer 3 has a larger thickness than that of the fourth metal layer 6. The second and fourth metal layers 3 and 6 for soldering contain at least nickel and have a higher solder wettability than that of the first and third metal layers 2 and 5. The first, third, and fourth metal layers 2, 5, and 6 are formed uniformly on the front or back surface of the semiconductor substrate 1 and not divided in a pattern. The second metal layer 3 is divided in a pattern and has a plurality of metal layers electrically connected to each other via the first metal layer 2.

Figure 2:
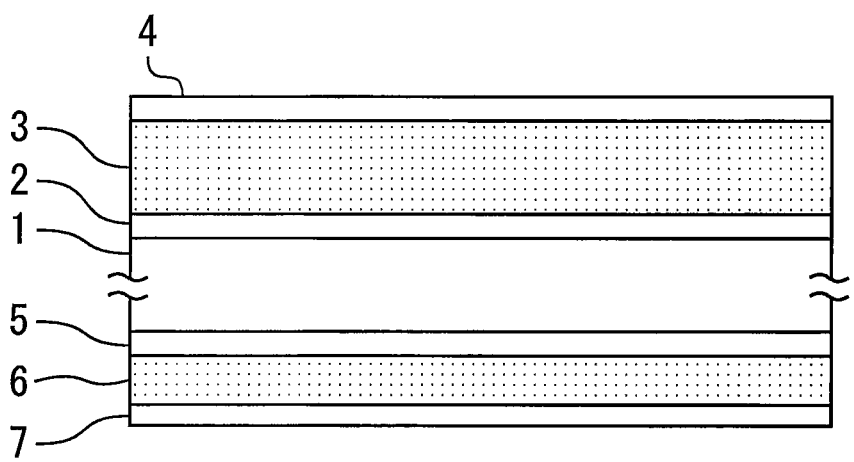
FIG. 2 is a cross-sectional view illustrating a semiconductor device according to the comparative example.

Next, the effects of this embodiment will be described in comparison to a comparative example. FIG. 2 is a cross-sectional view illustrating a semiconductor device according to the comparative example. The second and fourth metal layers 3 and 6 expand as the temperature rises and contract as the temperature lowers. In the comparative example, the thick second metal layer 3 on the front surface side is formed uniformly on the front surface of the semiconductor substrate 1 and not divided in a pattern. Therefore, the expansion and contraction with temperature changes occur more largely in the thick second metal layer 3 on the front surface side than in the fourth metal layer 6 on the back surface side. A difference then occurs between the stress applied by the second metal layer 3 on the front surface side to the semiconductor substrate 1 and the stress applied by the fourth metal layer 6 on the back surface side to the semiconductor substrate 1, resulting in warpage of the semiconductor substrate 1.

In contrast, according to this embodiment, while the first, third, and fourth metal layers 2, 5, and 6 are not divided in a pattern, the second metal layer 3 is divided in a pattern. The stress generated when the thick second metal layer 3 expands or contracts due to a temperature change is therefore mitigated by the gaps in the pattern. Therefore, the semiconductor substrate 1 receives less stress and warpage of the semiconductor substrate 1 can be minimized. Since there is no need to crystallize the second and fourth metal layers 3 and 6 by heat treatment for mitigating stress, the solder wettability is not degraded by oxidation. Consequently, the assemblability can be improved.

Embodiment 2

Figure 3:
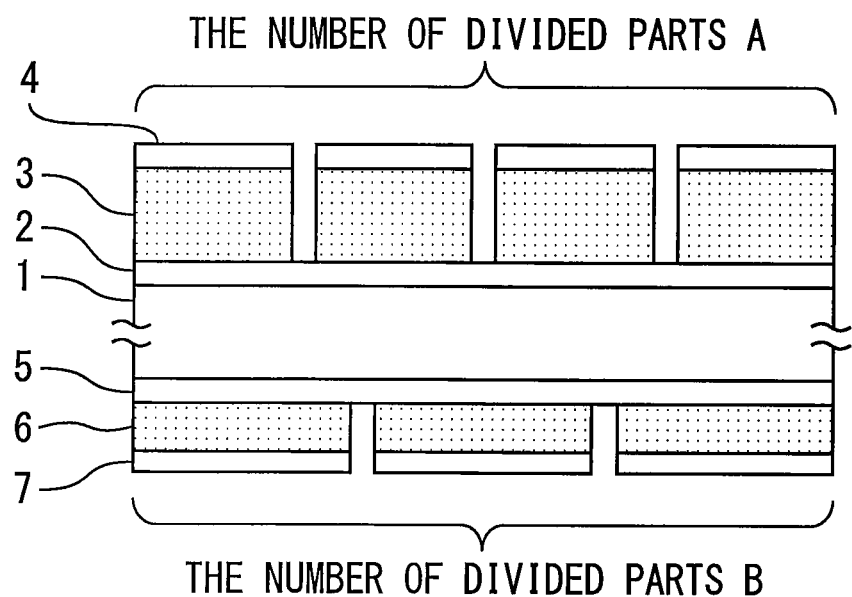
FIG. 3 is a cross-sectional view illustrating a semiconductor device according to Embodiment 2 of the present invention.

FIG. 3 is a cross-sectional view illustrating a semiconductor device according to Embodiment 2 of the present invention. Unlike Embodiment 1, the second and fourth metal layers 3 and 6 are both divided in a pattern. Namely, the second metal layer 3 is divided in a pattern and has a plurality of metal layers electrically connected to each other via the first metal layer 2. The fourth metal layer 6 is also divided in a pattern and has a plurality of metal layers electrically connected to each other via the third metal layer 5.

The number of divided parts A of the second metal layer 3 is larger than the number of divided parts B of the fourth metal layer 6 (A>B). The stress generated on the front surface is absorbed more readily than the stress generated on the back surface. Therefore, the difference between these stresses which the semiconductor substrate 1 receives is reduced, and thus warpage of the semiconductor substrate 1 can be minimized. Consequently, the assemblability can be improved.

Embodiment 3

Figure 4:
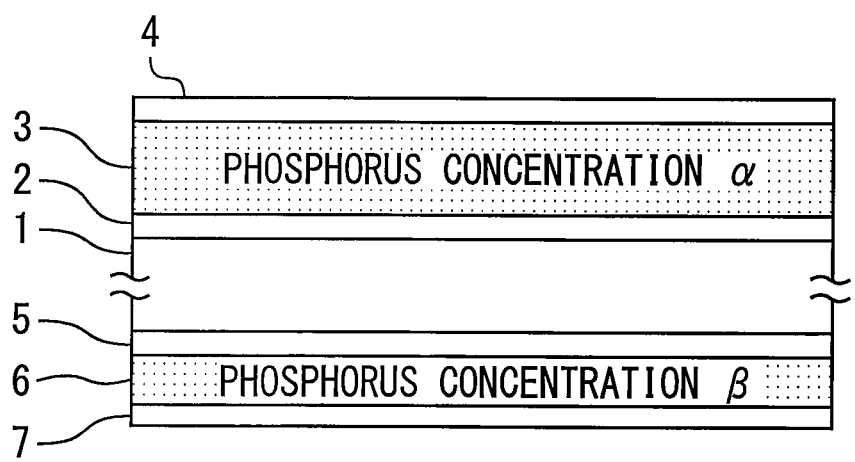
FIG. 4 is a cross-sectional view illustrating a semiconductor device according to Embodiment 3 of the present invention.

FIG. 4 is a cross-sectional view illustrating a semiconductor device according to Embodiment 3 of the present invention. Unlike Embodiment 1, the second metal layer 3 is formed uniformly on the front surface of the semiconductor substrate 1 and not divided in a pattern. The second and fourth metal layers 3 and 6 are made of amorphous nickel containing phosphorus formed by electroless plating.

Generally, nickel is used as the metal for soldering. Electroless plating is known as a method for forming a thick nickel layer. Electroless plating has a mechanism whereby metal deposits by the use of a reducing agent. It is known to use hypophosphorous acid as the reducing agent. In electroless plating that uses hypophosphorous acid for forming a nickel layer, nickel forms an alloy with the phosphorus in the hypophosphorous acid and deposits in an amorphous state.

As mentioned above, the second and fourth metal layers 3 and 6 expand and contract with temperature changes. The property parameter that indicates the degree of expansion due to a temperature change is a coefficient of linear expansion. The coefficient of linear expansion of a nickel-phosphorus alloy is known to vary in accordance with the concentration of phosphorus in nickel. The higher the phosphorus concentration, the smaller the coefficient of linear expansion.

In this embodiment, the second metal layer 3 has a higher phosphorus concentration a than the phosphorus concentration 13 of the fourth metal layer 6 ($\alpha > \beta$). Therefore, the magnitude of expansion and contraction per unit volume of the second metal layer 3 on the front surface due to a temperature change is smaller than that of the fourth metal layer 6 on the back surface. When compared to the case where the phosphorus concentration is the same for both surfaces, the difference between the stresses which the semiconductor substrate 1 receives with a temperature change is reduced, and thus warpage of the semiconductor substrate 1 can be minimized. Consequently, the assemblability can be improved.

While a Si substrate may be used generally as the semiconductor substrate 1 in Embodiments 1 to 3 described above, the substrate is not limited to Si substrates. Silicon carbide (SiC) substrates or gallium nitride (GaN) substrates that are harder than Si substrates may be used to reduce warpage of the semiconductor substrate 1. Power semiconductor devices that use a SiC substrate or a GaN substrate have high withstand voltage and permissible current density so that a size reduction is possible. By using such a smaller device, a semiconductor module having this device integrated therein can be made smaller. The device also has higher heat resistance, so that it is possible to reduce the size of heat dissipation fins of a heat sink, and to replace water-cooled components with air-cooled parts, whereby the semiconductor module can be made even smaller. Furthermore, the high efficiency of the low power loss device can enhance the efficiency of the semiconductor module.

REFERENCE SIGNS LIST 1 semiconductor substrate; 2 first metal layer; 3 second metal layer; 5 third metal layer; 6 fourth metal layer

The invention claimed is:
1. A semiconductor device comprising:
a semiconductor substrate having a front surface and a back surface that are opposite each other;
a first metal layer formed on the front surface of the semiconductor substrate;
a second metal layer for soldering formed on the first metal layer;

a third metal layer formed on the back surface of the semiconductor substrate; and
a fourth metal layer for soldering formed on the third metal layer,
wherein the second metal layer has a larger thickness than that of the fourth metal layer,
the first, third, and fourth metal layers are not divided in a pattern, and
the second metal layer is divided in a pattern and has a plurality of metal layers electrically connected to each other via the first metal layer.

2. The semiconductor device according to claim 1, wherein the second and fourth metal layers contain nickel.

3. The semiconductor device according to claim 1, wherein the second and fourth metal layers are not crystallized.

4. The semiconductor device according to claim 2, wherein the second and fourth metal layers are not crystallized.

5. The semiconductor device according to claim 1, wherein the semiconductor substrate is a SiC substrate or a GaN substrate.

6. The semiconductor device according to claim 2, wherein the semiconductor substrate is a SiC substrate or a GaN substrate.

7. The semiconductor device according to claim 3, wherein the semiconductor substrate is a SiC substrate or a GaN substrate.

8. The semiconductor device according to claim 4, wherein the semiconductor substrate is a SiC substrate or a GaN substrate.

9. A semiconductor device comprising:
a semiconductor substrate having a front surface and a back surface that are opposite each other;
a first metal layer formed on the front surface of the semiconductor substrate;
a second metal layer for soldering formed on the first metal layer;
a third metal layer formed on the back surface of the semiconductor substrate; and
a fourth metal layer for soldering formed on the third metal layer,
wherein the second metal layer has a larger thickness than that of the fourth metal layer,
the first and third metal layers are not divided in a pattern,
the second metal layer is divided in a pattern and has a plurality of metal layers electrically connected to each other via the first metal layer,
the fourth metal layer is divided in a pattern and has a plurality of metal layers electrically connected to each other via the third metal layer, and
the number of divided parts of the second metal layer is larger than the number of divided parts of the fourth metal layer.

10. The semiconductor device according to claim 9, wherein the second and fourth metal layers contain nickel.

11. The semiconductor device according to claim 9, wherein the second and fourth metal layers are not crystallized.

12. The semiconductor device according to claim 10, wherein the second and fourth metal layers are not crystallized.

13. The semiconductor device according to claim 9, wherein the semiconductor substrate is a SiC substrate or a GaN substrate.

14. The semiconductor device according to claim 10, wherein the semiconductor substrate is a SiC substrate or a GaN substrate.

15. The semiconductor device according to claim 11, wherein the semiconductor substrate is a SiC substrate or a GaN substrate.

16. The semiconductor device according to claim 12, wherein the semiconductor substrate is a SiC substrate or a GaN substrate.

17. A semiconductor device comprising:
a semiconductor substrate having a front surface and a back surface that are opposite each other;
a first metal layer formed on the front surface of the semiconductor substrate;
a second metal layer for soldering formed on the first metal layer;
a third metal layer formed on the back surface of the semiconductor substrate; and
a fourth metal layer for soldering formed on the third metal layer,
wherein the second metal layer has a larger thickness than that of the fourth metal layer,
the second and fourth metal layers are made of amorphous nickel containing phosphorus, and
the second metal layer has a higher phosphorus concentration than that of the fourth metal layer.

18. The semiconductor device according to claim 17, wherein the second and fourth metal layers are not crystallized.

19. The semiconductor device according to claim 17, wherein the semiconductor substrate is a SiC substrate or a GaN substrate.

20. The semiconductor device according to claim 18, wherein the semiconductor substrate is a SiC substrate or a GaN substrate.

* * * * *